(12) United States Patent
Iversen

(10) Patent No.: US 10,056,888 B2
(45) Date of Patent: Aug. 21, 2018

(54) RF PHASE OFFSET DETECTION CIRCUIT

(71) Applicant: Qorvo US, Inc., Greensboro, NC (US)

(72) Inventor: Christian Rye Iversen, Vestbjerg (DK)

(73) Assignee: Qorvo US, Inc., Greensboro, NC (US)

( * ) Notice: Subject to any disclaimer, the term of this patent is extended or adjusted under 35 U.S.C. 154(b) by 13 days.

(21) Appl. No.: 15/431,933

(22) Filed: Feb. 14, 2017

(65) Prior Publication Data

US 2017/0279439 A1 Sep. 28, 2017

Related U.S. Application Data

(60) Provisional application No. 62/313,293, filed on Mar. 25, 2016.

(51) Int. Cl.
| | |
|---|---|
| *H03K 5/13* | (2014.01) |
| *G01R 25/00* | (2006.01) |
| *H02H 3/30* | (2006.01) |
| *H03K 5/00* | (2006.01) |
| *G01R 23/00* | (2006.01) |

(52) U.S. Cl.
CPC ............ *H03K 5/13* (2013.01); *G01R 25/005* (2013.01); *H02H 3/302* (2013.01); *G01R 23/005* (2013.01); *H03K 2005/00286* (2013.01)

(58) Field of Classification Search
CPC ...... G01R 25/00; G01R 25/005; G01R 23/00; G01R 23/005; G05B 1/00; G01N 29/075; G01P 3/565; H03K 5/00; H03K 5/13; H03K 2005/00286; H02H 3/302; H02H 3/353; H02H 3/382

USPC ......... 324/76.11, 76.77, 76.82, 86, 107, 138, 324/500, 512, 521, 600, 612, 622
See application file for complete search history.

(56) References Cited

U.S. PATENT DOCUMENTS

| | | | | |
|---|---|---|---|---|
| 4,095,186 A * | 6/1978 | Vesel | ....................... | G01S 1/50 324/76.82 |
| 5,187,719 A * | 2/1993 | Birgenheier | ........... | G01R 25/00 332/150 |
| 6,859,761 B2 * | 2/2005 | Bensky | ................... | G01S 13/84 702/189 |
| 8,737,929 B2 * | 5/2014 | Cohen | .................... | H04B 17/12 455/67.11 |

(Continued)

OTHER PUBLICATIONS

Yeo, K.S. et al., "Non-sequential linear CMOS phase detector for CDR applications," IEEE Proceedings-Circuits, Devices and Systems, vol. 152, No. 6, Dec. 2005, pp. 667-672.

*Primary Examiner* — Hoai-An D Nguyen
(74) *Attorney, Agent, or Firm* — Withrow & Terranova, P.L.L.C.

(57) ABSTRACT

An RF phase offset detection system, which includes a first RF phase detector and a second RF phase detector, and measures a first phase offset between a first RF signal and a second RF signal, is disclosed. Each of the first RF signal and the second RF signal has a common RF frequency. The first RF phase detector detects and filters the first RF signal and the second RF signal to provide a first detection signal. The second RF phase detector receives and phase-shifts the second RF signal to provide a phase-shifted RF signal. The second RF phase detector further detects and filters the first RF signal and the phase-shifted RF signal to provide a second detection signal, such that a combination of the first detection signal and the second detection signal is representative of the first phase offset.

20 Claims, 13 Drawing Sheets

(56) References Cited

U.S. PATENT DOCUMENTS

| | | | |
|---|---|---|---|
| 9,225,507 B1 * | 12/2015 | Lye | H04L 7/0331 |
| 9,793,610 B2 * | 10/2017 | Wehrmann | H04B 1/0458 |
| 2007/0296396 A1 * | 12/2007 | Nakahira | G01R 25/00 |
| | | | 324/86 |
| 2016/0226429 A1 * | 8/2016 | Lee | G01R 31/343 |

* cited by examiner

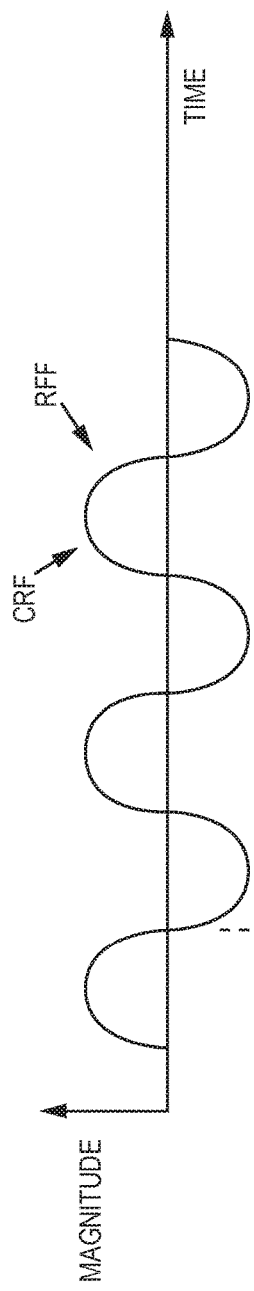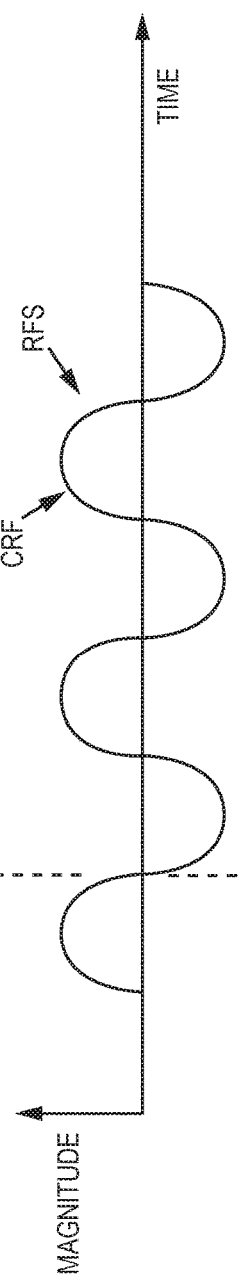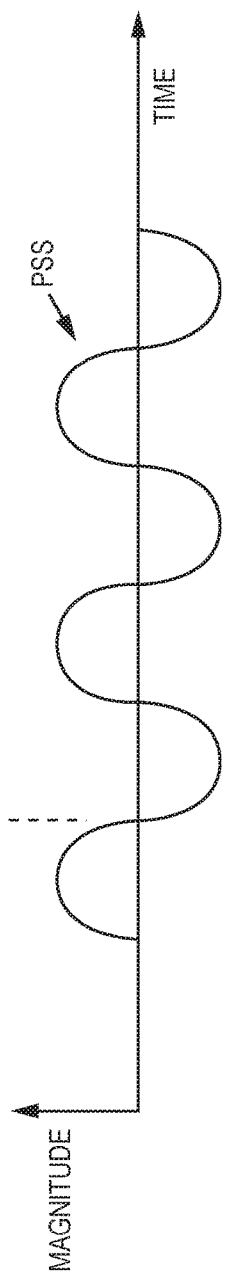

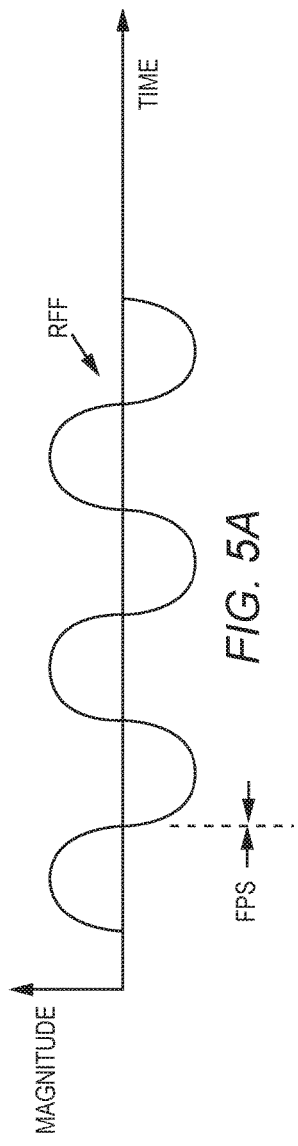
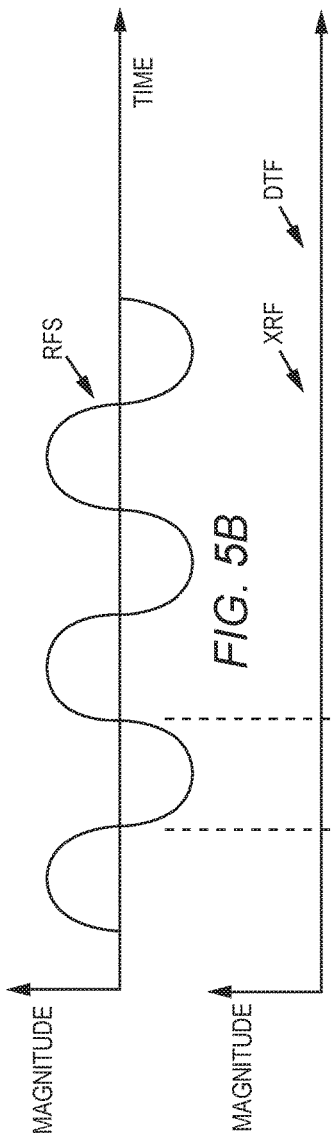
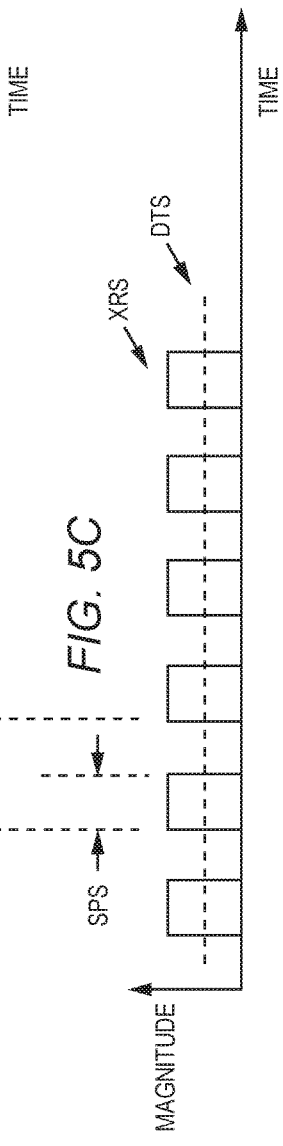
FIG. 5A
FIG. 5B
FIG. 5C
FIG. 5D

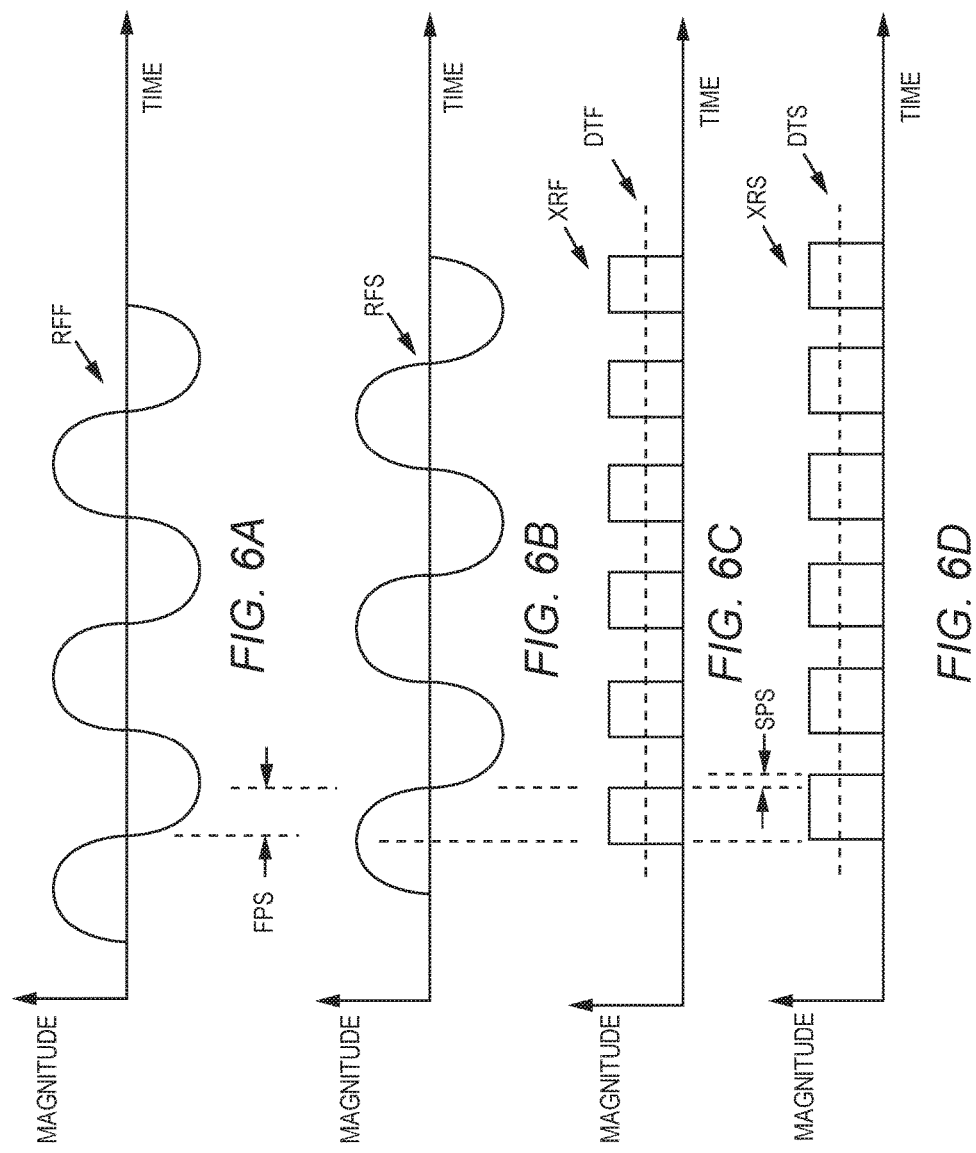

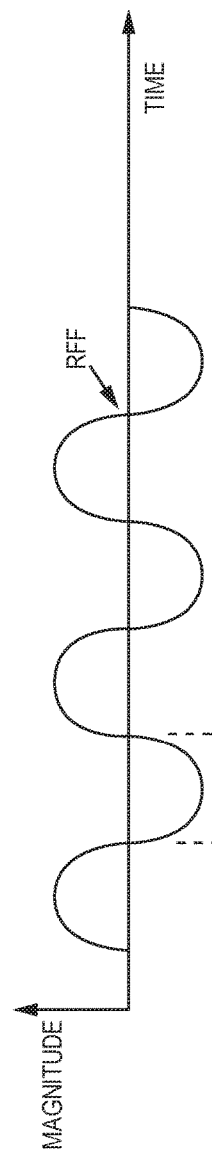
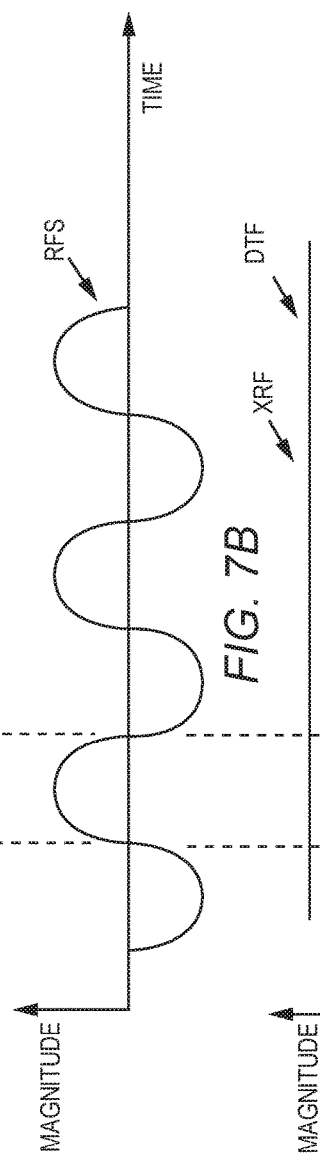
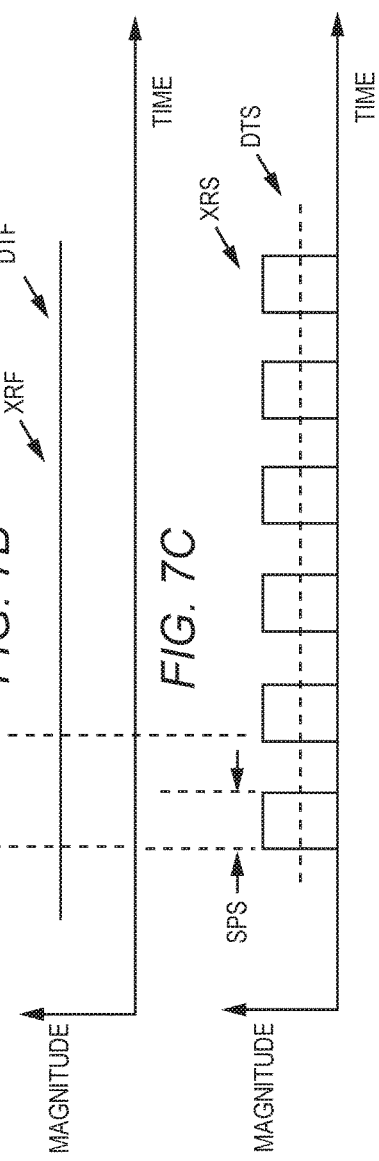
FIG. 7A
FIG. 7B
FIG. 7C
FIG. 7D

RF PHASE OFFSET DETECTION CIRCUIT

RELATED APPLICATIONS

This application claims the benefit of provisional patent application Ser. No. 62/313,293, filed Mar. 25, 2016, the disclosure of which is hereby incorporated herein by reference in its entirety.

FIELD OF THE DISCLOSURE

Embodiments of the present disclosure relate to radio frequency (RF) systems and circuits in general, and RF phase detectors and RF control systems in particular.

BACKGROUND

FIG. 1A shows a sequential phase detector 10 according to the prior art. The sequential phase detector 10 illustrated in FIG. 1 receives and detects a traditional RF input signal RFN to provide a traditional sequential detector output signal SDT, which is representative of a phase of the traditional RF input signal RFN. FIG. 1B is a graph illustrating a magnitude of the traditional sequential detector output signal SDT as it relates to the phase of the traditional RF input signal RFN according to the prior art. The sequential phase detector 10 utilizes a non-continuous detector function to provide the traditional sequential detector output signal SDT.

The magnitude of the traditional sequential detector output signal SDT varies in a linear manner, except when the phase of the traditional RF input signal RFN is equal to 0 degrees, 360 degrees, or multiples of 360 degrees, wherein the magnitude of the traditional sequential detector output signal SDT transitions quickly, or jumps. This quick transitioning or jumping behavior is a result of the non-continuous detector function, such that the traditional sequential detector output signal SDT is a non-continuous output signal. Additionally, the sequential phase detector 10 may utilize internal feedback to provide the traditional sequential detector output signal SDT. Such feedback may limit an operating bandwidth of the sequential phase detector 10. Thus, there is a need for a phase detector that utilizes a continuous detector function, thereby eliminating quick transitions or jumps and has a high operating bandwidth.

SUMMARY

An RF phase offset detection system, which includes a first RF phase detector and a second RF phase detector, is disclosed according to one embodiment of the present disclosure. The RF phase offset detection system measures a first phase offset between a first RF signal and a second RF signal, such that each of the first RF signal and the second RF signal has a common RF frequency. The first RF phase detector detects and filters the first RF signal and the second RF signal to provide a first detection signal. The second RF phase detector receives and phase-shifts the second RF signal to provide a phase-shifted RF signal. The second RF phase detector further detects, and filters the first RF signal and the phase-shifted RF signal to provide a second detection signal, such that a combination of the first detection signal and the second detection signal is representative of the first phase offset between the first RF signal and the second RF signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
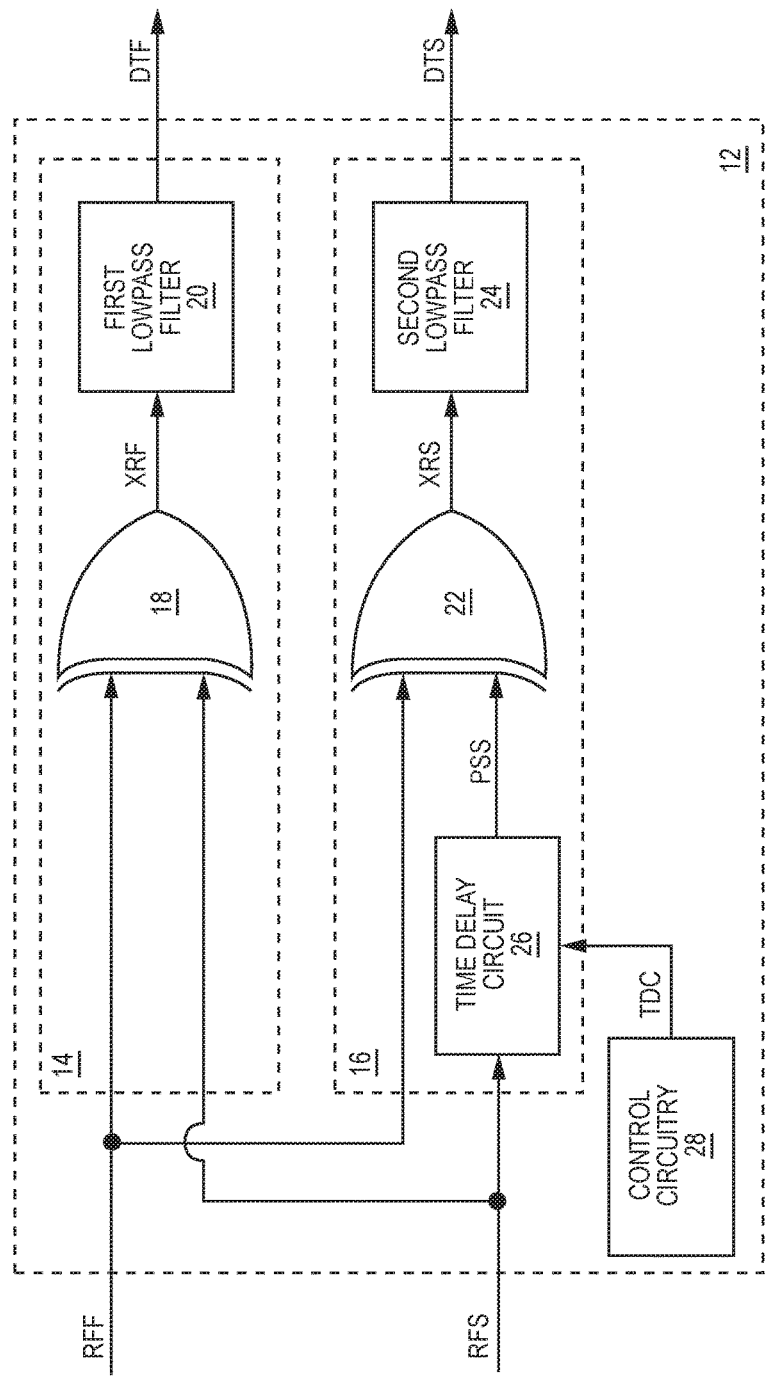
FIG. 3 shows the RF phase offset detection system according to an alternate embodiment of the RF phase offset detection system.

FIGS. 4A, 4B, and 4C are graphs illustrating a first RF signal, a second RF signal, and a phase-shifted RF signal, respectively, of the RF phase offset detection system shown in FIG. 3 according to one embodiment of the RF phase offset detection system.

FIGS. 5A, 5B, 5C, and 5D are graphs illustrating the first RF signal, the second RF signal, a first XOR output signal, and a second XOR output signal, respectively, of the RF phase offset detection system shown in FIG. 3 according to an alternate embodiment of the RF phase offset detection system.

FIGS. 6A, 6B, 6C, and 6D are graphs illustrating the first RF signal, the second RF signal, a first XOR output signal, and a second XOR output signal, respectively, of the RF phase offset detection system shown in FIG. 3 according to an additional embodiment of the RF phase offset detection system.

FIGS. 7A, 7B, 7C, and 7D are graphs illustrating the first RF signal, the second RF signal, a first XOR output signal, and a second XOR output signal, respectively, of the RF phase offset detection system shown in FIG. 3 according to another embodiment of the RF phase offset detection system.

Figure 8:
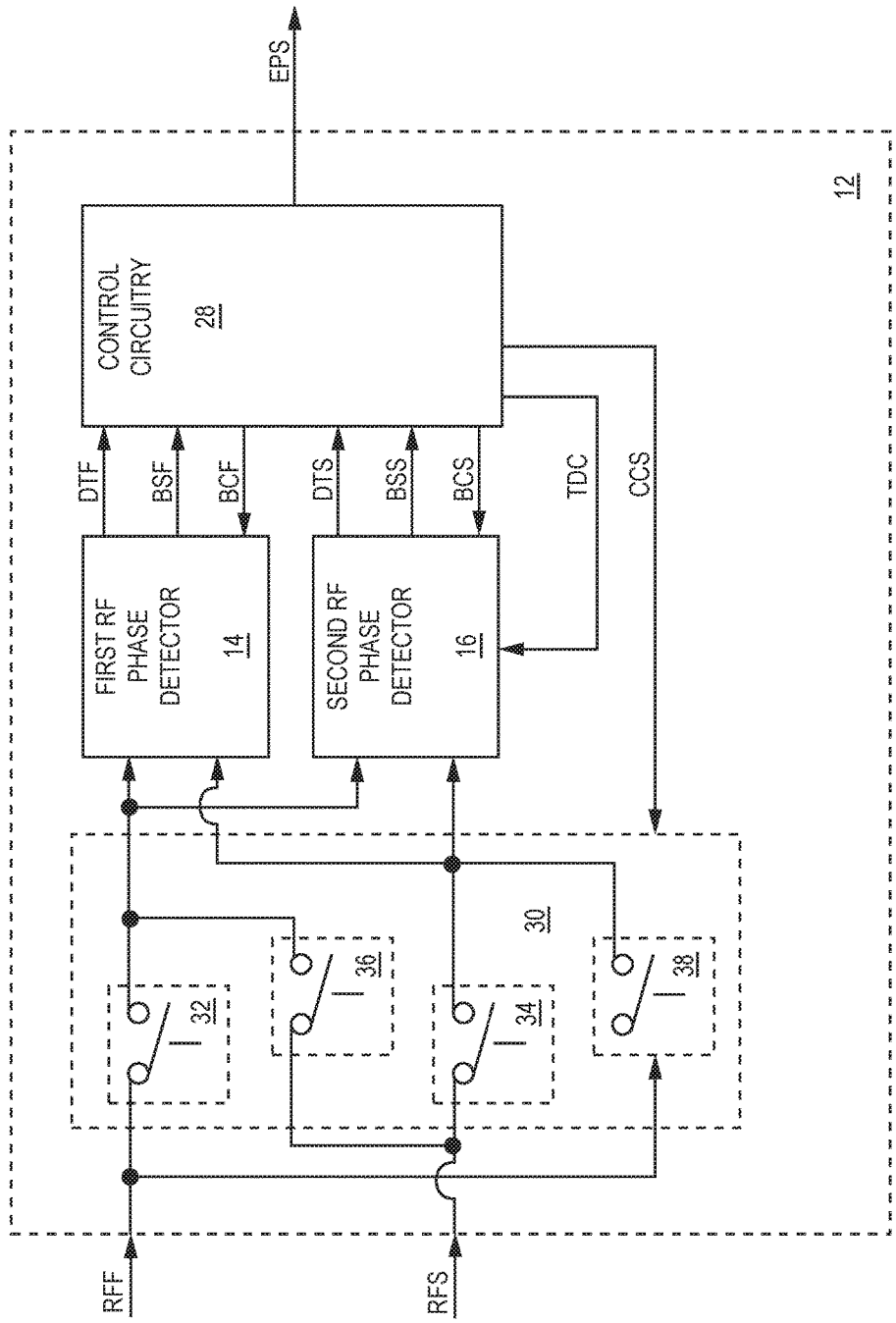

FIG. 8 shows the RF phase offset detection system according to an additional embodiment of the RF phase offset detection system.

Figure 9A:
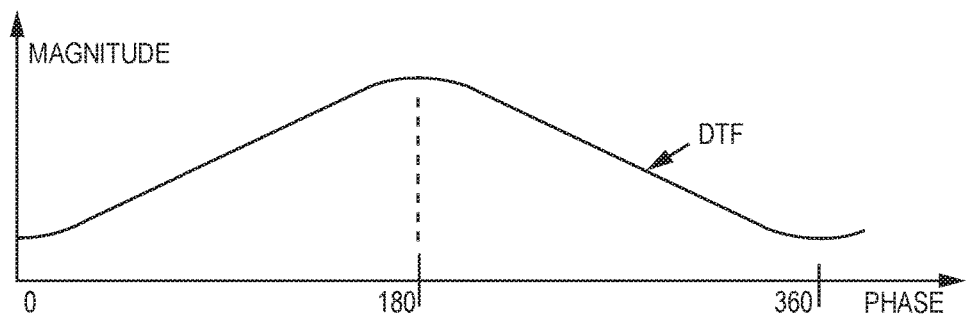
Figure 9B:
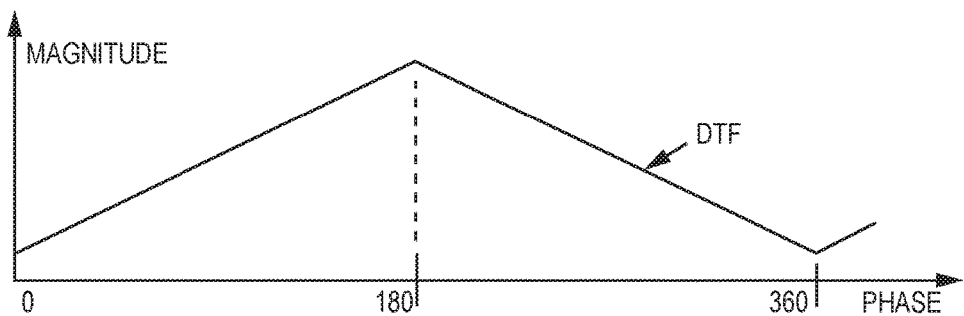

FIGS. 9A and 9B are graphs illustrating a first detection signal shown in the RF phase offset detection system illustrated in FIG. 8.

Figure 10A:
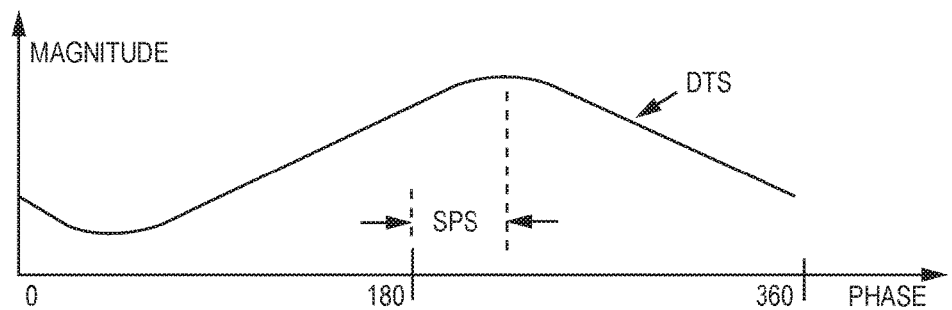
Figure 10B:
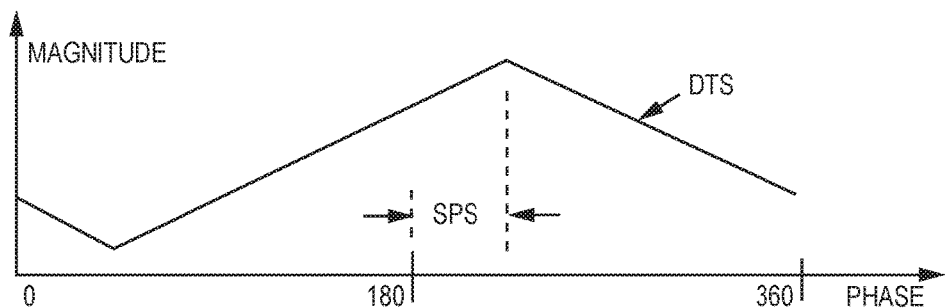

FIGS. 10A and 10B are graphs illustrating a second detection signal shown in the RF phase offset detection system 12 illustrated in FIG. 8.

Figure 11:
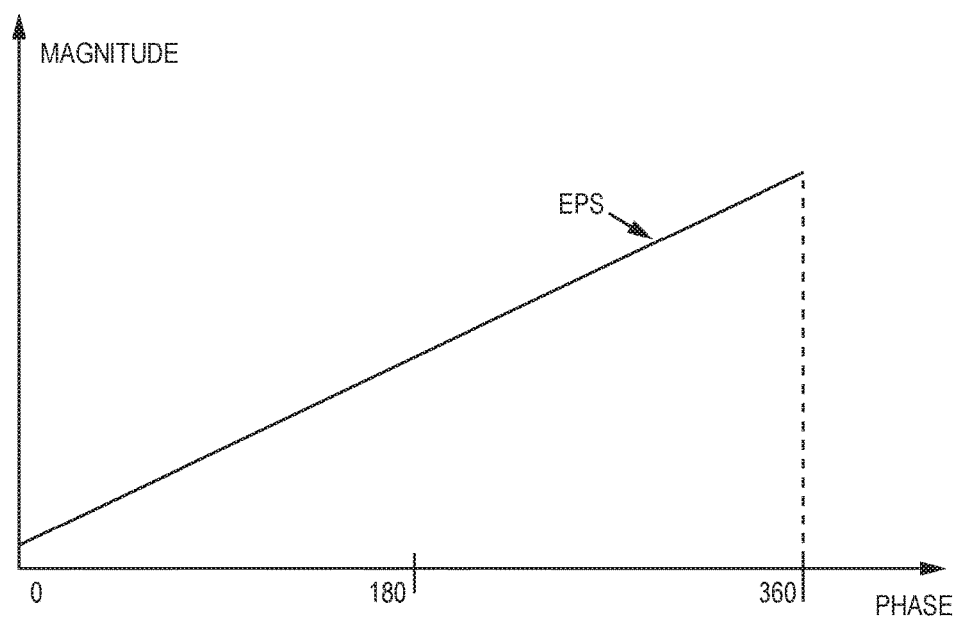

FIG. 11 is a graph illustrating an estimated phase output signal shown in the RF phase offset detection system 12 illustrated in FIG. 8.

Figure 12:
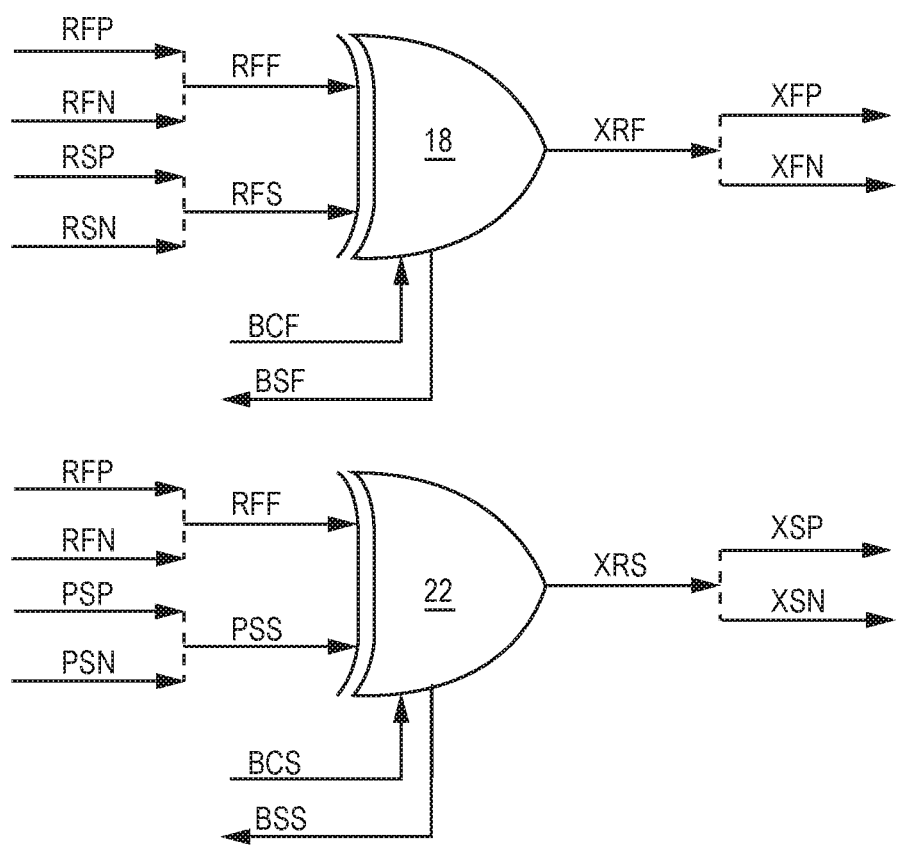

FIG. 12 shows details of a first XOR detector circuit and a second XOR detector circuit illustrated in FIG. 3 according to one embodiment of the first XOR detector circuit and the second XOR detector circuit.

Figure 13:
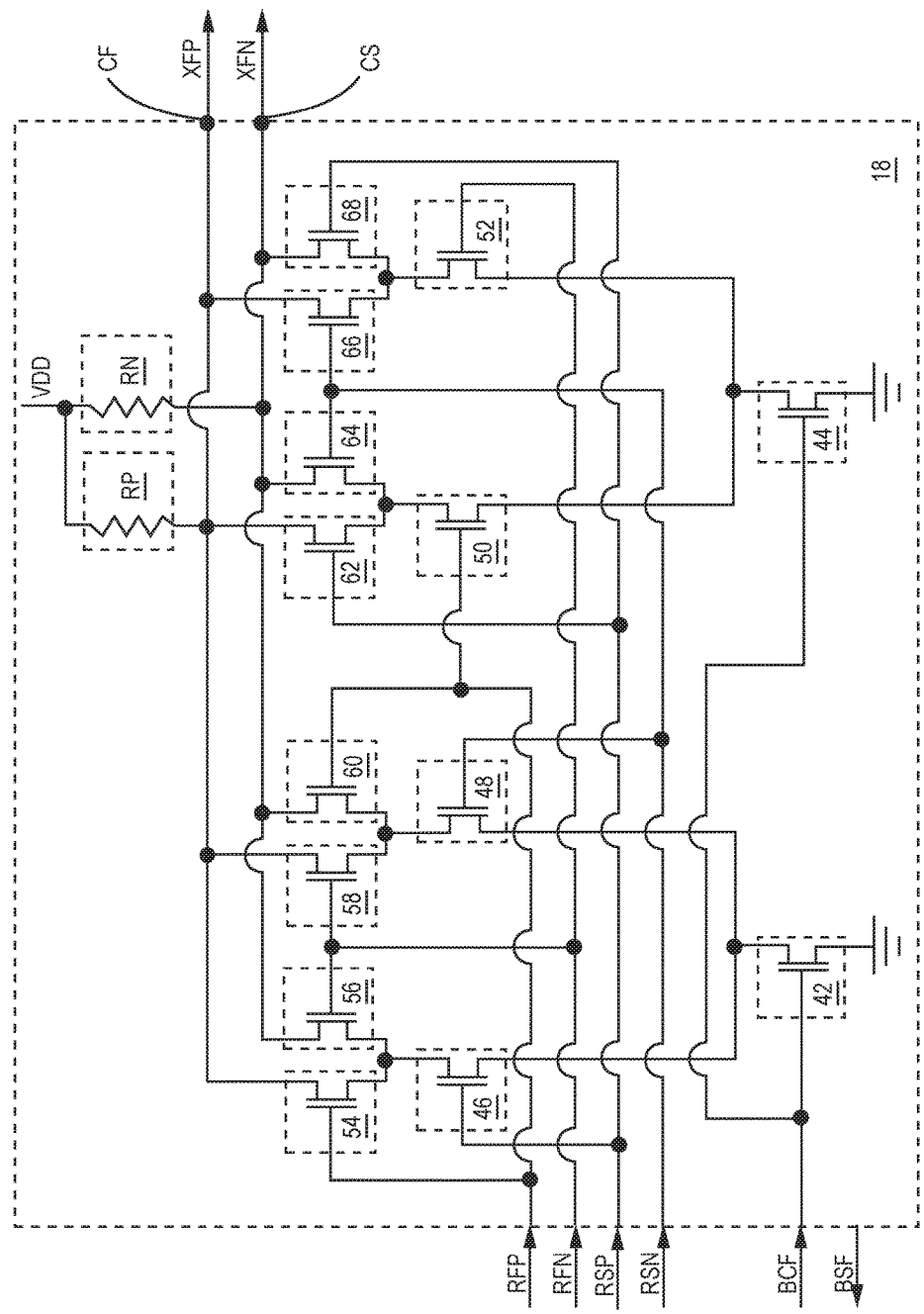

FIG. 13 shows details of the first XOR detector circuit illustrated in FIG. 12 according to one embodiment of the first XOR detector circuit.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An RF phase offset detection system, which includes a first RF phase detector and a second RF phase detector, is disclosed according to one embodiment of the present disclosure. The RF phase offset detection system measures a first phase offset between a first RF signal and a second RF signal, such that each of the first RF signal and the second RF signal has a common RF frequency. The first RF phase detector detects and filters the first RF signal and the second RF signal to provide a first detection signal. The second RF phase detector receives and phase-shifts the second RF signal to provide a phase-shifted RF signal. The second RF phase detector further detects and filters the first RF signal and the phase-shifted RF signal to provide a second detection signal, such that a combination of the first detection signal and the second detection signal is representative of the first phase offset between the first RF signal and the second RF signal.

Figure 2:
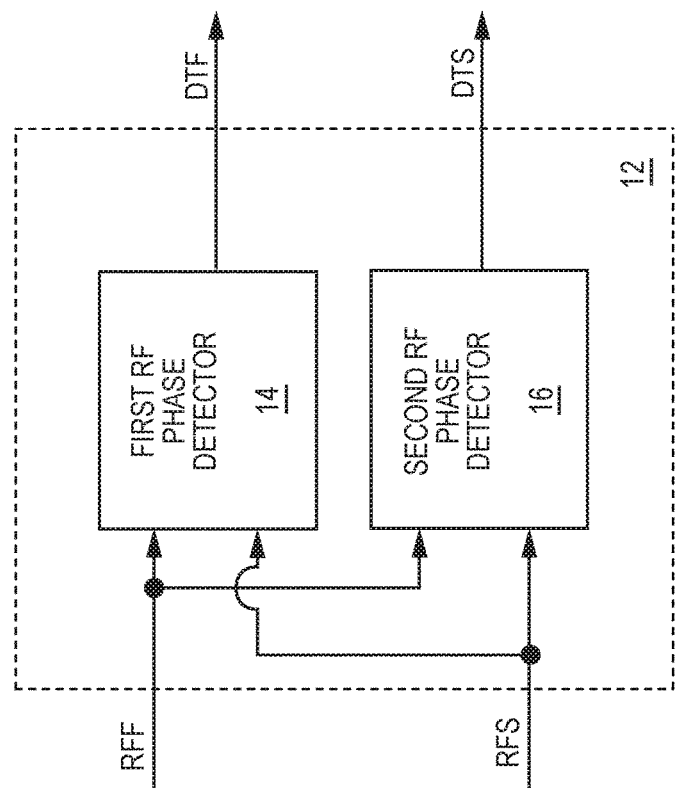
FIG. 2 shows an RF phase offset detection system according to one embodiment of the RF phase offset detection system.

FIG. 2 shows an RF phase offset detection system 12 according to one embodiment of the RF phase offset detection system 12. The RF phase offset detection system 12 includes a first RF phase detector 14 and a second RF phase detector 16. The RF phase offset detection system 12 measures a first phase offset FPS (FIGS. 4A and 4B) between a first RF signal RFF and a second RF signal RFS. The first RF signal RFF has a common RF frequency CRF (FIG. 4A) and the second RF signal RFS has the common RF frequency CRF (FIG. 4B).

In a first embodiment of the RF phase offset detection system 12, a measurement range of the RF phase offset detection system 12 is greater than 180 degrees; such that the first phase offset FPS (FIGS. 4A and 4B) ranges between zero degrees and greater than 180 degrees, between −90 degrees and greater than 90 degrees, between −180 degrees and greater than zero degrees, or the like. In a second embodiment of the RF phase offset detection system 12, the measurement range of the RF phase offset detection system 12 is 360 degrees, such that the first phase offset FPS (FIGS. 4A and 4B) ranges between zero degrees and 360 degrees, between −180 degrees and 180 degrees, between −360 degrees and zero degrees, or the like.

The first RF phase detector 14 detects and filters the first RF signal RFF and the second RF signal RFS to provide a first detection signal DTF. The second RF phase detector 16 receives and delays the second RF signal RFS to provide a phase-shifted RF signal PSS (FIG. 3 and FIG. 4C). As such, there is a second phase offset SPS (FIGS. 4B and 4C) between the second RF signal RFS and the phase-shifted RF signal PSS (FIG. 3 and FIG. 4C).

In a first embodiment of the second phase offset SPS (FIGS. 4B and 4C), the second phase offset SPS (FIGS. 4B and 4C) is greater than zero degrees and less than 180 degrees. In a second embodiment of the second phase offset SPS (FIGS. 4B and 4C), the second phase offset SPS (FIGS. 4B and 4C) is greater than five degrees. In a third embodiment of the second phase offset SPS (FIGS. 4B and 4C), the second phase offset SPS (FIGS. 4B and 4C) is greater than fifteen degrees. In a fourth embodiment of the second phase offset SPS (FIGS. 4B and 4C), the second phase offset SPS (FIGS. 4B and 4C) is greater than thirty degrees. In a fifth embodiment of the second phase offset SPS (FIGS. 4B and 4C), the second phase offset SPS (FIGS. 4B and 4C) is greater than forty-five degrees. In an exemplary embodiment of the second phase offset SPS (FIGS. 4B and 4C), the second phase offset SPS (FIGS. 4B and 4C) is greater than five degrees and less than 175 degrees.

The second RF phase detector 16 further detects and filters the first RF signal RFF and the phase-shifted RF signal PSS (FIG. 3 and FIG. 4C) to provide a second detection signal DTS, such that a combination of the first detection signal DTF and the second detection signal DTS is representative of the first phase offset FPS (FIGS. 4A and 4B) between the first RF signal RFF and the second RF signal RFS.

In one embodiment of the first RF phase detector 14, the first RF phase detector 14 implements a continuous detector function, such that the first detection signal DTF is a continuous output signal. In one embodiment of the second RF phase detector 16, the second RF phase detector 16 implements a continuous detector function, such that the second detection signal DTS is a continuous output signal.

In one embodiment of the first RF phase detector 14, the first RF phase detector 14 functions as a non-sequential phase detector. In one embodiment of the second RF phase detector 16, the second RF phase detector 16 functions as a non-sequential phase detector. A non-sequential phase detector is defined as a phase detector that excludes internal feedback signal paths.

FIG. 3 shows the RF phase offset detection system 12 according to an alternate embodiment of the RF phase offset detection system 12. The RF phase offset detection system 12 illustrated in FIG. 3 is similar to the RF phase offset detection system 12 illustrated in FIG. 2, except the RF phase offset detection system 12 illustrated in FIG. 3 shows details of the first RF phase detector 14 and the second RF phase detector 16. The first RF phase detector 14 includes a first exclusive-OR (XOR) detector circuit 18 and a first lowpass filter 20. The second RF phase detector 16 includes a second XOR detector circuit 22, a second lowpass filter 24, and a time delay circuit 26, which is coupled to the second XOR detector circuit 22. Additionally, the RF phase offset detection system 12 further includes control circuitry 28.

The first XOR detector circuit 18 detects the first RF signal RFF and the second RF signal RFS to provide a first XOR output signal XRF, such that the first detection signal DTF is based on the first XOR output signal XRF. The first lowpass filter 20 receives and filters the first XOR output signal XRF to provide the first detection signal DTF. In general, the first XOR detector circuit 18 provides the first XOR output signal XRF using the first RF signal RFF and the second RF signal RFS, such that the first detection signal DTF is based on the first XOR output signal XRF.

The time delay circuit 26 receives and delays the second RF signal RFS to provide the phase-shifted RF signal PSS. The second XOR detector circuit 22 detects the first RF signal RFF and the phase-shifted RF signal PSS to provide a second XOR output signal XRS, such that the second detection signal DTS is based on the second XOR output signal XRS, which, in general, is based on the first RF signal RFF and the phase-shifted RF signal PSS. In this regard, the second lowpass filter 24 receives and filters the second XOR output signal XRS to provide the second detection signal DTS. In general, the second XOR detector circuit 22 provides the second XOR output signal XRS using the first RF signal RFF and based on the second RF signal RFS.

In one embodiment of the first XOR detector circuit 18, the first XOR detector circuit 18 is a symmetrical XOR detector circuit. In one embodiment of the second XOR detector circuit 22, the second XOR detector circuit 22 is a symmetrical XOR detector circuit. In one embodiment of the second RF phase detector 16, the second XOR detector circuit 22 provides the second XOR output signal XRS using the first XOR output signal XRF and based on the second RF signal RFS. In one embodiment of the first XOR detector circuit 18, the first XOR detector circuit 18 includes a first group of switching transistor elements 46, 48, 50, 52, 54, 56, 58, 60, 62, 64, 66, 68 (FIG. 13), such that each of the first group of switching transistor elements is a metal oxide semiconductor (MOS) Current Mode Logic (MCML) switching transistor element. In one embodiment of the second XOR detector circuit 22, the second XOR detector circuit 22 includes a second group of switching transistor elements (not shown), such that each of the second group of switching transistor elements is an MCML switching transistor element. In one embodiment of the second group of switching transistor elements (not shown), each of the second group of switching transistor elements is similar to a corresponding one of the first group of switching transistor elements 46, 48, 50, 52, 54, 56, 58, 60, 62, 64, 66, 68 (FIG. 13).

In one embodiment of the RF phase offset detection system 12, the control circuitry 28 provides a time delay control signal TDC to the time delay circuit 26, such that the control circuitry 28 selects the second phase offset SPS (FIGS. 4B and 4C) using the time delay control signal TDC. In an alternate embodiment of the RF phase offset detection system 12, the control circuitry 28 is omitted.

FIGS. 4A, 4B, and 4C are graphs illustrating the first RF signal RFF, the second RF signal RFS, and the phase-shifted RF signal PSS, respectively, of the RF phase offset detection system 12 shown in FIG. 3 according to one embodiment of the RF phase offset detection system 12. The first RF signal RFF has the common RF frequency CRF and the second RF signal RFS has the common RF frequency CRF. The first RF signal RFF and the second RF signal RFS have the first phase offset FPS between the first RF signal RFF and the second RF signal RFS. The phase-shifted RF signal PSS and the second RF signal RFS have the second phase offset SPS between the phase-shifted RF signal PSS and the second RF signal RFS, such that the phase-shifted RF signal PSS is delayed from the second RF signal RFS by the second phase offset SPS.

In one embodiment of the common RF frequency CRF, the common RF frequency CRF is between 1 Megahertz and 100 Gigahertz. In a first embodiment of the common RF frequency CRF, the common RF frequency CRF is greater than 1 Gigahertz. In a second embodiment of the common RF frequency CRF, the common RF frequency CRF is greater than 2 Gigahertz. In a third embodiment of the common RF frequency CRF, the common RF frequency CRF is greater than 3 Gigahertz. In a fourth embodiment of the common RF frequency CRF, the common RF frequency CRF is greater than 4 Gigahertz. In a fifth embodiment of the common RF frequency CRF, the common RF frequency CRF is greater than 5 Gigahertz.

In a sixth embodiment of the common RF frequency CRF, the common RF frequency CRF is greater than 6 Gigahertz. In a seventh embodiment of the common RF frequency CRF, the common RF frequency CRF is greater than 7 Gigahertz. In an eighth embodiment of the common RF frequency CRF, the common RF frequency CRF is greater than 8 Gigahertz. In a ninth embodiment of the common RF frequency CRF, the common RF frequency CRF is greater than 9 Gigahertz. In a tenth embodiment of the common RF frequency CRF, the common RF frequency CRF is greater than 10 Gigahertz.

FIGS. 5A, 5B, 5C, and 5D are graphs illustrating the first RF signal RFF, the second RF signal RFS, the first XOR output signal XRF, and the second XOR output signal XRS, respectively, of the RF phase offset detection system 12 shown in FIG. 3 according to an alternate embodiment of the RF phase offset detection system 12.

Decision thresholds of the first XOR detector circuit 18 (FIG. 3) and the second XOR detector circuit 22 (FIG. 3) are equal to zero according to one embodiment of the first XOR detector circuit 18 (FIG. 3) and the second XOR detector circuit 22 (FIG. 3). In this regard, when both inputs to the first XOR detector circuit 18 (FIG. 3) are positive, an output from the first XOR detector circuit 18 (FIG. 3) is a logic-LOW. Further, when both inputs to the first XOR detector circuit 18 (FIG. 3) are negative, the output from the first XOR detector circuit 18 (FIG. 3) is a logic-LOW. However, when one input to the first XOR detector circuit 18 (FIG. 3) is positive and another input to the first XOR detector circuit 18 (FIG. 3) is negative, the output from the first XOR detector circuit 18 (FIG. 3) is a logic-HIGH. The second XOR detector circuit 22 (FIG. 3) behaves in a similar manner to the first XOR detector circuit 18 (FIG. 3) according to one embodiment of the second XOR detector circuit 22 (FIG. 3).

The first RF signal RFF and the second RF signal RFS illustrated in FIGS. 5A and 5B, respectively, are phase-aligned according to one embodiment of the first RF signal RFF and the second RF signal RFS, such that the first phase offset FPS is equal to zero. Since the first XOR detector circuit 18 (FIG. 3) receives and processes the first RF signal RFF and the second RF signal RFS to provide the first XOR output signal XRF, the first XOR output signal XRF is equal to zero, as illustrated in FIG. 5C. The first lowpass filter 20 (FIG. 3) receives and lowpass filters the first XOR output signal XRF to provide the first detection signal DTF, such that the first detection signal DTF is also equal to zero.

The second phase offset SPS is between the second RF signal RFS and the phase-shifted RF signal PSS (FIG. 3). Since the second XOR detector circuit 22 (FIG. 3) receives and processes the first RF signal RFF and the phase-shifted RF signal PSS to provide the second XOR output signal XRS, the second XOR output signal XRS is not equal to zero, as illustrated in FIG. 5D. The second lowpass filter 24 (FIG. 3) receives and lowpass filters the second XOR output signal XRS to provide the second detection signal DTS, such that the second detection signal DTS is not equal to zero.

Figure 1A:
FIG. 1A shows a sequential phase detector according to the prior art.
Figure 1B:
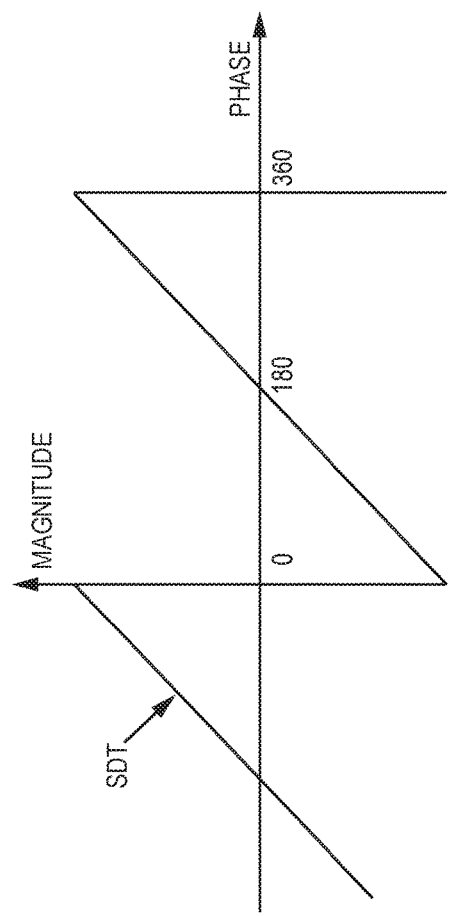
FIG. 1B is a graph illustrating a traditional sequential detector output signal and a phase of a traditional RF input signal illustrated in FIG. 1A according to the prior art.

In this regard, in one embodiment of the RF phase offset detection system 12 (FIG. 3), by ensuring that the second XOR output signal XRS is not equal to zero when the first XOR output signal XRF is equal to zero enables the RF phase offset detection system 12 (FIG. 3) to avoid the output jumps associated with the sequential phase detector 10 (FIG. 1).

FIGS. 6A, 6B, 6C, and 6D are graphs illustrating the first RF signal RFF, the second RF signal RFS, the first XOR output signal XRF, and the second XOR output signal XRS, respectively, of the RF phase offset detection system 12 shown in FIG. 3 according to an additional embodiment of the RF phase offset detection system 12. Further, FIGS. 6C and 6D illustrate the first detection signal DTF and the second detection signal DTS, respectively, of the RF phase offset detection system 12 illustrated in FIG. 3.

The first RF signal RFF, the second RF signal RFS, the first XOR output signal XRF, and the second XOR output signal XRS illustrated in FIGS. 6A, 6B, 6C, and 6D, respectively, are similar to the first RF signal RFF, the second RF signal RFS, the first XOR output signal XRF, and the second XOR output signal XRS, respectively, illustrated in FIGS. 5A, 5B, 5C, and 5D, respectively, except in the first RF signal RFF, the second RF signal RFS, the first XOR output signal XRF, and the second XOR output signal XRS illustrated in FIGS. 6A, 6B, 6C, and 6D, respectively, the first phase offset FPS is equal to about 90 degrees and the second phase offset SPS is between zero and 90 degrees.

As a result, each of the first XOR output signal XRF and the second XOR output signal XRS are not equal to zero, as processed by the first XOR detector circuit 18 (FIG. 3) and the second XOR detector circuit 22 (FIG. 3), respectively. The first lowpass filter 20 (FIG. 3) receives and lowpass filters the first XOR output signal XRF to provide the first detection signal DTF, such that the first detection signal DTF is not equal to zero. The second lowpass filter 24 (FIG. 3) receives and lowpass filters the second XOR output signal XRS to provide the second detection signal DTS, such that the second detection signal DTS is not equal to zero.

FIGS. 7A, 7B, 7C, and 7D are graphs illustrating the first RF signal RFF, the second RF signal RFS, the first XOR output signal XRF, and the second XOR output signal XRS, respectively, of the RF phase offset detection system 12 shown in FIG. 3 according to another embodiment of the RF phase offset detection system 12. Further, FIGS. 7C and 7D illustrate the first detection signal DTF and the second detection signal DTS, respectively, of the RF phase offset detection system 12 illustrated in FIG. 3.

The first RF signal RFF, the second RF signal RFS, the first XOR output signal XRF, and the second XOR output signal XRS illustrated in FIGS. 7A, 7B, 7C, and 7D, respectively, are similar to the first RF signal RFF, the second RF signal RFS, the first XOR output signal XRF, and the second XOR output signal XRS, respectively, illustrated in FIGS. 6A, 6B, 6C, and 6D, respectively, except in the first RF signal RFF, the second RF signal RFS, the first XOR output signal XRF, and the second XOR output signal XRS illustrated in FIGS. 7A, 7B, 7C, and 7D, respectively, the first phase offset FPS is equal to about 180 degrees and the second phase offset SPS is equal to about 90 degrees.

Since the first XOR detector circuit 18 (FIG. 3) receives and processes the first RF signal RFF and the second RF signal RFS to provide the first XOR output signal XRF, the first XOR output signal XRF is equal to a maximum magnitude, as illustrated in FIG. 5C. The first lowpass filter 20 (FIG. 3) receives and lowpass filters the first XOR output signal XRF to provide the first detection signal DTF, such that the first detection signal DTF is also equal to the maximum magnitude.

Further, the second XOR output signal XRS is not equal to zero, as processed by the second XOR detector circuit 22 (FIG. 3). The second lowpass filter 24 (FIG. 3) receives and lowpass filters the second XOR output signal XRS to provide the second detection signal DTS, such that the second detection signal DTS is not equal to zero.

FIG. 8 shows the RF phase offset detection system 12 according to an additional embodiment of the RF phase offset detection system 12. The RF phase offset detection system 12 illustrated in FIG. 8 is similar to the RF phase offset detection system 12 illustrated in FIG. 3, except the RF phase offset detection system 12 illustrated in FIG. 8 further includes calibration switching circuitry 30.

The calibration switching circuitry 30 includes a first operation switch 32, a second operation switch 34, a first calibration switch 36, and a second calibration switch 38. The first calibration switch 36 is coupled to both the first RF phase detector 14 and the second RF phase detector 16. The second calibration switch 38 is coupled to both the first RF phase detector 14 and the second RF phase detector 16. The first operation switch 32 is coupled to both the first RF phase detector 14 and the second RF phase detector 16. The second operation switch 34 is coupled to both the first RF phase detector 14 and the second RF phase detector 16.

In one embodiment of the RF phase offset detection system 12, the RF phase offset detection system 12 operates in one of a normal operation mode and a calibration mode. In one embodiment of the control circuitry 28, the control circuitry 28 selects the one of the normal operation mode and the calibration mode. In general, during the normal operation mode, the control circuitry 28 forwards both the first RF signal RFF and the second RF signal RFS to each of the first RF phase detector 14 and the second RF phase detector 16 using the calibration switching circuitry 30.

In one embodiment of the RF phase offset detection system 12, the control circuitry 28 provides a calibration control signal CCS to the calibration switching circuitry 30. As such, the control circuitry 28 selects the first calibration switch 36 to be ON or OFF using the calibration control signal CCS. The control circuitry 28 selects the second calibration switch 38 to be ON or OFF using the calibration control signal CCS. The control circuitry 28 selects the first operation switch 32 to be ON or OFF using the calibration control signal CCS. The control circuitry 28 selects the second operation switch 34 to be ON or OFF using the calibration control signal CCS.

In one embodiment of the RF phase offset detection system 12, during the normal operation mode, the control circuitry 28 controls each of the first calibration switch 36, the second calibration switch 38, the first operation switch 32, and the second operation switch 34 using the calibration control signal CCS, such that the first calibration switch 36 is OFF, the second calibration switch 38 is OFF, the first operation switch 32 is ON, and the second operation switch 34 is ON. In this regard, in one embodiment of the RF phase offset detection system 12, during the normal operation mode, the control circuitry 28 forwards the first RF signal RFF to each of the first RF phase detector 14 and the second RF phase detector 16 using the first operation switch 32; and the control circuitry 28 forwards the second RF signal RFS to each of the first RF phase detector 14 and the second RF phase detector 16 using the second operation switch 34.

In a first embodiment of the RF phase offset detection system 12, during the calibration mode, the control circuitry 28 controls each of the first calibration switch 36, the second calibration switch 38, the first operation switch 32, and the second operation switch 34 using the calibration control signal CCS, such that the first calibration switch 36 is ON, the second calibration switch 38 is OFF, the first operation switch 32 is ON, and the second operation switch 34 is OFF. In this regard, in the first embodiment of the RF phase offset detection system 12, during the calibration mode, the control circuitry 28 forwards the first RF signal RFF to both inputs of each of the first RF phase detector 14 and the second RF phase detector 16 using the first calibration switch 36 and the first operation switch 32, such that a phase offset between the inputs of the first RF phase detector 14 is zero and a phase offset between the inputs of the second RF phase detector 16 is zero. In this regard, during the calibration mode, the control circuitry 28 uses both the first detection signal DTF and the second detection signal DTS as calibration error signals, which are used to correct the first detection signal DTF and the second detection signal DTS during the normal operation mode.

In a second embodiment of the RF phase offset detection system 12, during the calibration mode, the control circuitry 28 controls each of the first calibration switch 36, the second calibration switch 38, the first operation switch 32, and the second operation switch 34 using the calibration control signal CCS, such that the first calibration switch 36 is OFF, the second calibration switch 38 is ON, the first operation switch 32 is OFF, and the second operation switch 34 is ON. In this regard, in the second embodiment of the RF phase offset detection system 12, during the calibration mode, the control circuitry 28 forwards the second RF signal RFS to both inputs of each of the first RF phase detector 14 and the second RF phase detector 16 using the second calibration switch 38 and the second operation switch 34, such that a phase offset between the inputs of the first RF phase detector 14 is zero and a phase offset between the inputs of the second RF phase detector 16 is zero. In this regard, during the calibration mode, the control circuitry 28 uses both the first detection signal DTF and the second detection signal DTS as calibration error signals, which are used to correct the first detection signal DTF and the second detection signal DTS during the normal operation mode.

In a general embodiment of the RF phase offset detection system 12, during the calibration mode, the control circuitry 28 uses the calibration switching circuitry 30 to forward a selected one of the first RF signal RFF and the second RF signal RFS to both inputs of the first RF phase detector 14 and to both inputs of the second RF phase detector 16, such that a phase offset between the inputs of the first RF phase detector 14 is zero and a phase offset between the inputs of the second RF phase detector 16 is zero. In this regard, during the calibration mode, the control circuitry 28 uses both the first detection signal DTF and the second detection signal DTS as calibration error signals, which are used to correct the first detection signal DTF and the second detection signal DTS during the normal operation mode.

In one embodiment of the RF phase offset detection system 12, the control circuitry 28 provides a first bias control signal BCF to the first RF phase detector 14 and a second bias control signal BCS to the second RF phase detector 16. In one embodiment of the RF phase offset detection system 12, the first RF phase detector 14 provides a first bias sense signal BSF to the control circuitry 28 and the second RF phase detector 16 provides a second bias sense signal BSS to the control circuitry 28. In one embodiment of the RF phase offset detection system 12, the first XOR detector circuit 18 (FIG. 12) provides the first bias sense signal BSF to the control circuitry 28, such that the first bias sense signal BSF is representative of a bias of the first XOR detector circuit 18 (FIG. 12). Similarly, the second XOR detector circuit 22 (FIG. 12) provides the second bias sense signal BSS to the control circuitry 28, such that the second bias sense signal BSS is representative of a bias of the second XOR detector circuit 22 (FIG. 12).

In one embodiment of the RF phase offset detection system 12, the control circuitry 28 provides the first bias control signal BCF to the first XOR detector circuit 18 (FIG. 12) and provides the second bias control signal BCS (FIG. 12) to the second XOR detector circuit 22 (FIG. 12). In this regard, in one embodiment of the RF phase offset detection system 12, the control circuitry 28 regulates the bias of the first XOR detector circuit 18 (FIG. 12) using the first bias control signal BCF and regulates the bias of the second XOR detector circuit 22 (FIG. 12) using the second bias control signal BCS. In one embodiment of the RF phase offset detection system 12, the control circuitry 28 regulates the bias of the first XOR detector circuit 18 (FIG. 12) using the first bias control signal BCF based on the first bias sense signal BSF and regulates the bias of the second XOR detector circuit 22 (FIG. 12) using the second bias control signal BCS based on the second bias sense signal BSS.

In one embodiment of the RF phase offset detection system 12, the control circuitry 28 uses the bias sense signals BSF, BSS as part of a feedback system to regulate the bias of the first XOR detector circuit 18 (FIG. 12) and the bias of the second XOR detector circuit 22 (FIG. 12) using the bias control signals BCF, BCS. In one embodiment of the RF phase offset detection system 12, the control circuitry 28 at least partially regulates scaling of the first detection signal DTF and the second detection signal DTS in presence of process variations, supply voltage variations, temperature variations, the like, or any combination thereof.

In one embodiment of the RF phase offset detection system 12, the control circuitry 28 uses the first detection signal DTF and the second detection signal DTS to provide an estimated phase output signal EPS, which is representative of the first phase offset FPS (FIG. 4A and FIG. 4B). In this regard, the RF phase offset detection system 12 provides a continuous detector function as illustrated in FIG. 11.

FIGS. 9A and 9B are graphs illustrating a magnitude of the first detection signal DTF shown in the RF phase offset detection system 12 illustrated in FIG. 8 versus the first phase offset FPS (FIG. 4A and FIG. 4B). FIG. 9A illustrates the magnitude of the first detection signal DTF as it is received from the first RF phase detector 14 (FIG. 8). The first RF phase detector 14 (FIG. 8) provides a continuous detector function as illustrated in FIG. 9A. However, when the first phase offset FPS (FIG. 4A and FIG. 4B) is close to 0 degrees, 180 degrees, or 360 degrees, the magnitude of the first detection signal DTF is distorted. FIG. 9B illustrates an ideal response of the magnitude of the first detection signal DTF.

In one embodiment of the control circuitry 28, the control circuitry 28 provides a piecewise linear detector function of the first detection signal DTF to obtain an improved phase response that approaches the ideal response of the magnitude of the first detection signal DTF as illustrated in FIG. 9B.

FIGS. 10A and 10B are graphs illustrating the second detection signal DTS shown in the RF phase offset detection system 12 illustrated in FIG. 8 versus the first phase offset FPS (FIG. 4A and FIG. 4B). FIG. 10A illustrates the magnitude of the second detection signal DTS as it is received from the second RF phase detector 16 (FIG. 8). The second RF phase detector 16 (FIG. 8) provides a continuous detector function as illustrated in FIG. 10A.

However, when the first phase offset FPS (FIG. 4A and FIG. 4B) is close to 0 degrees, 180 degrees, or 360 degrees plus the second phase offset SPS, the magnitude of second detection signal DTS is distorted. FIG. 10B illustrates an ideal response of the magnitude of the second detection signal DTS. In one embodiment of the control circuitry 28, the control circuitry 28 provides a piecewise linear detector function of the second detection signal DTS to obtain an improved phase response that approaches the ideal response of the magnitude of the second detection signal DTS illustrated in FIG. 10B.

FIG. 11 is a graph illustrating the estimated phase output signal EPS shown in the RF phase offset detection system 12 illustrated in FIG. 8. The control circuitry 28 provides a piecewise linear detector function of the RF phase offset detection system 12 using the first detection signal DTF and the second detection signal DTS, such that the estimated phase output signal EPS illustrated in FIG. 11 is based on the piecewise linear detector function.

FIG. 12 shows the first XOR detector circuit 18 and the second XOR detector circuit 22 illustrated in FIG. 3 according to one embodiment of the first XOR detector circuit 18 and the second XOR detector circuit 22. The first XOR detector circuit 18 receives the first bias control signal BCF and provides the first bias sense signal BSF. Further, the first XOR detector circuit 18 receives the first RF signal RFF and the second RF signal RFS, and provides the first XOR output signal XRF based on the first RF signal RFF and the second RF signal RFS.

In one embodiment of the first RF signal RFF, the first RF signal RFF includes a first positive RF signal RFP and a first negative RF signal RFN, such that the first positive RF signal RFP and the first negative RF signal RFN are differential RF signals. In one embodiment of the second RF signal RFS, the second RF signal RFS includes a second positive RF signal RSP and a second negative RF signal RSN, such that the second positive RF signal RSP and the second negative RF signal RSN are differential RF signals. In one embodiment of the first XOR output signal XRF, the first XOR output signal XRF includes a first positive XOR signal XFP and a first negative XOR signal XFN, such that the first positive XOR signal XFP and the first negative XOR signal XFN are differential signals.

The second XOR detector circuit 22 receives the second bias control signal BCS and provides the second bias sense signal BSS. Further, the second XOR detector circuit 22 receives the first RF signal RFF and the phase-shifted RF signal PSS, and provides the second XOR output signal XRS based on the first RF signal RFF and the phase-shifted RF signal PSS.

In one embodiment of the first RF signal RFF, the first RF signal RFF includes the first positive RF signal RFP and the first negative RF signal RFN, such that the first positive RF signal RFP and the first negative RF signal RFN are differential RF signals. In one embodiment of the phase-shifted RF signal PSS, the phase-shifted RF signal PSS includes a positive phase-shifted RF signal PSP and a negative phase-shifted RF signal PSN, such that the positive phase-shifted RF signal PSP and the negative phase-shifted RF signal PSN are differential RF signals. In one embodiment of the second XOR output signal XRS, the second XOR output signal XRS includes a second positive XOR signal XSP and a second negative XOR signal XSN, such that the second positive XOR signal XSP and the second negative XOR signal XSN are differential signals.

FIG. 13 shows details of the first XOR detector circuit 18 illustrated in FIG. 12 according to one embodiment of the first XOR detector circuit 18. The first XOR detector circuit 18 illustrated in FIG. 13 is a symmetrical XOR detector circuit. As such, the first XOR detector circuit 18 has a first connection node CF and a second connection node CS. In addition, the first XOR detector circuit 18 includes a positive-side resistive element RP coupled between the first connection node CF and a DC power source VDD, and further includes a negative-side resistive element RN coupled between the second connection node CS and the DC power source VDD.

The first XOR detector circuit 18 further includes a first bias transistor element 42, a second bias transistor element 44, a first intermediate transistor element 46, a second intermediate transistor element 48, a third intermediate transistor element 50, a fourth intermediate transistor element 52, a first output transistor element 54, a second output transistor element 56, a third output transistor element 58, a fourth output transistor element 60, a fifth output transistor element 62, a sixth output transistor element 64, a seventh output transistor element 66, and an eighth output transistor element 68.

A group of bias transistor elements 42, 44 includes the first bias transistor element 42 and the second bias transistor element 44 according to one embodiment of the group of bias transistor elements 42, 44. In an alternate embodiment of the group of bias transistor elements 42, 44, the first bias transistor element 42, the second bias transistor element 44, or both is omitted. A group of intermediate transistor elements 46, 48, 50, 52 includes the first intermediate transistor element 46, the second intermediate transistor element 48, the third intermediate transistor element 50, and the fourth intermediate transistor element 52 according to one embodiment of the group of intermediate transistor elements 46, 48, 50, 52. In an alternate embodiment of the group of intermediate transistor elements 46, 48, 50, 52, any or all of the group of intermediate transistor elements 46, 48, 50, 52 is omitted.

A group of positive-side output transistor elements 54, 58, 62, 66 includes the first output transistor element 54, the third output transistor element 58, the fifth output transistor element 62, and the seventh output transistor element 66 according to one embodiment of the group of positive-side output transistor elements 54, 58, 62, 66. In an alternate embodiment of the group of positive-side output transistor elements 54, 58, 62, 66, any or all of the group of positive-side output transistor elements 54, 58, 62, 66 is omitted.

A group of negative-side output transistor elements 56, 60, 64, 68 includes the second output transistor element 56, the fourth output transistor element 60, the sixth output transistor element 64, and the eighth output transistor element 68 according to one embodiment of the group of negative-side output transistor elements 56, 60, 64, 68. In an alternate embodiment of the group of negative-side output transistor elements 56, 60, 64, 68, any or all of the group of negative-side output transistor elements 56, 60, 64, 68 is omitted.

In one embodiment of the first bias transistor element 42, the first bias transistor element 42 is coupled between the first intermediate transistor element 46 and ground. In one embodiment of the first bias transistor element 42, the first bias transistor element 42 is further coupled between the second intermediate transistor element 48 and ground. In one embodiment of the second bias transistor element 44, the second bias transistor element 44 is coupled between the third intermediate transistor element 50 and ground. In one embodiment of the second bias transistor element 44, the second bias transistor element 44 is further coupled between the fourth intermediate transistor element 52 and ground.

In one embodiment of the first output transistor element 54, the first output transistor element 54 is coupled between the first connection node CF and the first intermediate transistor element 46. In one embodiment of the second output transistor element 56, the second output transistor element 56 is coupled between the second connection node CS and the first intermediate transistor element 46. In one embodiment of the third output transistor element 58, the third output transistor element 58 is coupled between the first connection node CF and the second intermediate transistor element 48. In one embodiment of the fourth output transistor element 60, the fourth output transistor element 60 is coupled between the second connection node CS and the second intermediate transistor element 48.

In one embodiment of the fifth output transistor element 62, the fifth output transistor element 62 is coupled between the first connection node CF and the third intermediate transistor element 50. In one embodiment of the sixth output transistor element 64, the sixth output transistor element 64 is coupled between the second connection node CS and the third intermediate transistor element 50. In one embodiment of the seventh output transistor element 66, the seventh output transistor element 66 is coupled between the first connection node CF and the fourth intermediate transistor element 52. In one embodiment of the eighth output transistor element 68, the eighth output transistor element 68 is coupled between the second connection node CS and the fourth intermediate transistor element 52.

In general, in one embodiment of the first XOR detector circuit 18, each of the group of positive-side output transistor elements 54, 58, 62, 66 is coupled between the first connection node CF and a corresponding one of the group of intermediate transistor elements 46, 48, 50, 52. Similarly, each of the group of negative-side output transistor elements 56, 60, 64, 68 is coupled between the second connection node CS and a corresponding one of the group of intermediate transistor elements 46, 48, 50, 52.

In one embodiment of the first XOR detector circuit 18, each of the third intermediate transistor element 50, the first output transistor element 54, and the fourth output transistor element 60 receives the first positive RF signal RFP. As such, each of the third intermediate transistor element 50, the first output transistor element 54, and the fourth output transistor element 60 is selected to be ON or OFF based on the first positive RF signal RFP.

In one embodiment of the first XOR detector circuit 18, each of the fourth intermediate transistor element 52, the second output transistor element 56, and the third output transistor element 58 receives the first negative RF signal RFN. As such, each of the fourth intermediate transistor element 52, the second output transistor element 56, and the third output transistor element 58 is selected to be ON or OFF based on the first negative RF signal RFN.

In one embodiment of the first XOR detector circuit 18, each of the first intermediate transistor element 46, the fifth output transistor element 62, and the eighth output transistor element 68 receives the second positive RF signal RSP. As such, each of the first intermediate transistor element 46, the fifth output transistor element 62, and the eighth output transistor element 68 is selected to be ON or OFF based on the second positive RF signal RSP.

In one embodiment of the first XOR detector circuit 18, each of the second intermediate transistor element 48, the sixth output transistor element 64, and the seventh output transistor element 66 receives the second negative RF signal RSN. As such, each of the second intermediate transistor element 48, the sixth output transistor element 64, and the seventh output transistor element 66 is selected to be ON or OFF based on the second negative RF signal RSN.

In one embodiment of the group of intermediate transistor elements 46, 48, 50, 52, each of the group of intermediate transistor elements 46, 48, 50, 52 is an MCML switching transistor element. In one embodiment of the group of positive-side output transistor elements 54, 58, 62, 66, each of the group of positive-side output transistor elements 54, 58, 62, 66 is an MCML switching transistor element. In one embodiment of the group of negative-side output transistor elements 56, 60, 64, 68, each of the group of negative-side output transistor elements 56, 60, 64, 68 is an MCML switching transistor element.

In one embodiment of the first XOR detector circuit 18, each of the first bias transistor element 42 and the second bias transistor element 44 receives the first bias control signal BCF. As such, the bias of the first XOR detector circuit 18 is based on the first bias control signal BCF. In one embodiment of the first XOR detector circuit 18, the first XOR detector circuit 18 provides the first bias sense signal BSF, which is representative of the bias of the first XOR detector circuit 18.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) phase offset detection system configured to measure a first phase offset between a first RF signal and a second RF signal, and comprising:
   a first RF phase detector configured to detect and filter the first RF signal and the second RF signal to provide a first detection signal, wherein each of the first RF signal and the second RF signal has a common RF frequency; and
   a second RF phase detector configured to:
      receive and delay the second RF signal to provide a phase-shifted RF signal, wherein a second phase offset is between the second RF signal and the phase-shifted RF signal; and
      detect and filter the first RF signal and the phase-shifted RF signal to provide a second detection signal, wherein a combination of the first detection signal and the second detection signal is representative of the first phase offset.

2. The RF phase offset detection system of claim 1 wherein:
   the first RF phase detector is further configured to implement a continuous detector function, such that the first detection signal is a continuous output signal; and
   the second RF phase detector is further configured to implement a continuous detector function, such that the second detection signal is a continuous output signal.

3. The RF phase offset detection system of claim 1 wherein:
   the first RF phase detector is further configured to function as a non-sequential phase detector; and
   the second RF phase detector is further configured to function as a non-sequential phase detector.

4. The RF phase offset detection system of claim 1 wherein the second RF phase detector comprises a time delay circuit configured to receive and delay the second RF signal to provide the phase-shifted RF signal.

5. The RF phase offset detection system of claim 1 wherein the second phase offset is greater than zero degrees and less than 180 degrees.

6. The RF phase offset detection system of claim 1 wherein a measurement range of the RF phase offset detection system is greater than 180 degrees.

7. The RF phase offset detection system of claim 1 wherein a measurement range of the RF phase offset detection system is 360 degrees.

8. The RF phase offset detection system of claim 1 wherein:
   the first RF phase detector comprises a first exclusive-OR (XOR) detector circuit configured to detect the first RF signal and the second RF signal to provide a first XOR output signal, such that the first detection signal is based on the first XOR output signal; and
   the second RF phase detector comprises a second XOR detector circuit and a time delay circuit, which is coupled to the second XOR detector circuit, such that:
      the time delay circuit is configured to receive and delay the second RF signal to provide the phase-shifted RF signal; and
      the second XOR detector circuit is configured to detect the first RF signal and the phase-shifted RF signal to provide a second XOR output signal, such that the second detection signal is based on the second XOR output signal.

9. The RF phase offset detection system of claim 1 wherein:
   the first RF phase detector comprises a first lowpass filter configured to receive and filter a first XOR output signal to provide the first detection signal, such that the first XOR output signal is based on the first RF signal and the second RF signal; and
   the second RF phase detector comprises a second lowpass filter configured to receive and filter a second XOR output signal to provide the second detection signal, such that the second XOR output signal is based on the first RF signal and the phase-shifted RF signal.

10. The RF phase offset detection system of claim 1 wherein the common RF frequency is greater than 1 Gigahertz.

11. The RF phase offset detection system of claim 1 wherein the second RF phase detector comprises a time delay circuit configured to receive and delay the second RF signal to provide the phase-shifted RF signal.

12. The RF phase offset detection system of claim 11 further comprising control circuitry configured to:
   provide a time delay control signal to the time delay circuit; and
   select the second phase offset using the time delay control signal.

13. The RF phase offset detection system of claim 1 further comprising control circuitry and calibration switching circuitry, wherein the first RF phase detector has two inputs, the second RF phase detector has two inputs, and the control circuitry is configured to:
   select one of a normal operation mode and a calibration mode; and
   during the normal operation mode, forward both the first RF signal and the second RF signal to each of the first RF phase detector and the second RF phase detector using the calibration switching circuitry; and
   during the calibration mode, forward a selected one of the first RF signal and the second RF signal to both inputs of the first RF phase detector and to both inputs of the second RF phase detector using the calibration switching circuitry.

14. The RF phase offset detection system of claim 13 wherein:
   the selected one of the first RF signal and the second RF signal is the first RF signal;
   the calibration switching circuitry comprises a first calibration switch, a second calibration switch, a first operation switch, and a second operation switch;
   during the normal operation mode, the control circuitry is further configured to:
      forward the first RF signal to each of the first RF phase detector and the second RF phase detector using the first operation switch; and
      forward the second RF signal to each of the first RF phase detector and the second RF phase detector using the second operation switch; and
   during the calibration mode, the control circuitry is further configured to forward the first RF signal to both inputs of the first RF phase detector and to both inputs of the second RF phase detector using the first calibration switch and the first operation switch.

15. The RF phase offset detection system of claim 1 further comprising control circuitry, wherein:
   the first RF phase detector comprises a first XOR detector circuit configured to provide a first XOR output signal using the first RF signal and the second RF signal, such that the first detection signal is based on the first XOR output signal;

the second RF phase detector comprises a second XOR detector circuit configured to provide a second XOR output signal using the first RF signal and based on the second RF signal, such that the second detection signal is based on the second XOR output signal; and the control circuitry is configured to:
regulate a bias of the first XOR detector circuit using a first bias control signal; and
regulate a bias of the second XOR detector circuit using a second bias control signal.

16. The RF phase offset detection system of claim 15 wherein:
the first RF phase detector is configured to provide a first bias sense signal, which is representative of the bias of the first XOR detector circuit;
the second RF phase detector is configured to provide a second bias sense signal, which is representative of the bias of the second XOR detector circuit; and
the control circuitry is further configured to:
regulate the bias of the first XOR detector circuit based on the first bias sense signal; and
regulate the bias of the second XOR detector circuit based on the second bias sense signal.

17. The RF phase offset detection system of claim 1 further comprising control circuitry configured to provide an estimated phase output signal using the first detection signal and the second detection signal, wherein the estimated phase output signal is representative of the first phase offset.

18. The RF phase offset detection system of claim 17 wherein the control circuitry is further configured to provide a piecewise linear detector function of the RF phase offset detection system using the first detection signal and the second detection signal, such that the estimated phase output signal is based on the piecewise linear detector function.

19. The RF phase offset detection system of claim 1 wherein:
the first RF phase detector comprises a first XOR detector circuit configured to provide a first XOR output signal using the first RF signal and the second RF signal, such that the first detection signal is based on the first XOR output signal;
the second RF phase detector comprises a second XOR detector circuit configured to provide a second XOR output signal using the first RF signal and based on the second RF signal, such that the second detection signal is based on the second XOR output signal;
the first XOR detector circuit is a symmetrical XOR detector circuit; and
the second XOR detector circuit is a symmetrical XOR detector circuit.

20. The RF phase offset detection system of claim 1 wherein:
the first RF phase detector comprises a first XOR detector circuit configured to provide a first XOR output signal using the first RF signal and the second RF signal, such that the first detection signal is based on the first XOR output signal;
the second RF phase detector comprises a second XOR detector circuit configured to provide a second XOR output signal using the first RF signal and based on the second RF signal, such that the second detection signal is based on the second XOR output signal;
the first XOR detector circuit comprises a first plurality of switching transistor elements, such that each of the first plurality of switching transistor elements is a metal oxide semiconductor (MOS) Current Mode Logic (MCML) switching transistor element; and
the second XOR detector circuit comprises a second plurality of switching transistor elements, such that each of the second plurality of switching transistor elements is an MCML switching transistor element.

* * * * *